(12) United States Patent
Maeda et al.

(10) Patent No.: US 6,566,678 B1
(45) Date of Patent: May 20, 2003

(54) SEMICONDUCTOR DEVICE HAVING A SOLID-STATE IMAGE SENSOR

(75) Inventors: Atsushi Maeda, Tokyo (JP); Kiyohiko Sakakibara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/121,699

(22) Filed: Apr. 15, 2002

(30) Foreign Application Priority Data

Nov. 26, 2001 (JP) .......................................... 2001-359160

(51) Int. Cl.$^7$ .............................................. H01L 29/06
(52) U.S. Cl. ......................................................... 257/22
(58) Field of Search .................. 257/22, 212, 213–218, 257/220–222, 247

(56) References Cited

FOREIGN PATENT DOCUMENTS

| JP | 59-107568 | 6/1984 |
| JP | 6-85233 | 3/1994 |

OTHER PUBLICATIONS

JP 59–107568, "Solid State Image Sensor", Abstract, pp. 337–342, 1984.*

* cited by examiner

*Primary Examiner*—Carl Whitehead, Jr.
*Assistant Examiner*—Yennhu B. Huynh
(74) *Attorney, Agent, or Firm*—Oblon, Spivak, McClelland, Maier & Neustadt, P.C.

(57) ABSTRACT

A semiconductor device having a solid-state image sensor is provided in which the leakage current is less likely to occur. The surface portion of a P-type semiconductor substrate (1) is susceptible to various defects, which are likely to cause the leakage current. Accordingly an N-type buried channel layer (7a) is provided. While the potential is high in the vicinity of the surface of the P-type semiconductor substrate (1) where defects are present, the potential is minimized in the vicinity of the PN junction plane formed by the N-type buried channel layer (7a) and the P-type semiconductor substrate (1). Accordingly, when a transfer switch (M1) is operated, a channel is formed in the vicinity of this PN junction plane, so that a charge stored in an N-type source region (4a) of the photodiode (PD) can be transferred to an N-type drain region (5) without suffering leakage current.

6 Claims, 8 Drawing Sheets

SEMICONDUCTOR DEVICE HAVING A SOLID-STATE IMAGE SENSOR

BACKGROUND OF THE INVENTION

1. Field of the Invention

The present invention relates to a semiconductor device having a solid-state image sensor.

2. Description of the Background Art

Recently, a type of solid-state image sensor which uses an amplification-type sensor is suggested. This type of device is characterized in that the light signal detected in the photoelectric conversion storage portion is amplified in the close vicinity of the photoelectric conversion storage portion.

FIG. 9 is a diagram showing the circuit configuration of a semiconductor device having a CMOS (Complementary Metal Oxide Semiconductor) type image sensor as a solid-state image sensor. As shown in FIG. 9, unit pixels or unit cells, C, are arranged in a matrix, where the individual cells C are connected to a vertical shift register VS and a horizontal shift register HS.

Each unit cell C has a photodiode PD, a transfer switch M1, a reset switch M2, an amplifier M3, and a select switch M4. The photodiode PD serves as the photoelectric conversion storage portion which converts the incident light into an electric signal and stores the generated charge. The transfer switch M1 serves to transfer the converted electric signal to the amplifier M3; the transfer switch M1 is controlled by signal from the vertical shift register VS. The reset switch M2 serves to reset the signal charge and the amplifier M3 serves to amplify the electric signal.

The transfer switch M1, the reset switch M2, the amplifier M3, and the select switch M4 are each formed of an MOS transistor.

FIG. 10 is a top view which specifically shows the structure of the region R shown in FIG. 9. FIG. 11 is the cross-sectional view taken along the line XI—XI in FIG. 10.

As shown in FIGS. 10 and 11, an element isolation insulating layer 103 is formed by LOCOS (Local Oxidation of Silicon) in the surface of a P-type semiconductor substrate 102. The photodiode PD, the transfer switch M1, and the reset switch M2 are closely arranged in the surface of the P-type semiconductor substrate 102.

The photodiode PD is formed of a PN junction between the P-type semiconductor substrate 102 and an N-type impurity region (an N-type active region) 104. A P-type impurity region (a P-type active region) 105 is formed over the N-type impurity region 104 (or in the vicinity of the surface of the P-type semiconductor substrate 102). This P-type impurity region 105 is formed to such a depth that the depletion layer at the PN junction between the P-type semiconductor substrate 102 and the N-type impurity region 104 will not reach it. The role of the P-type impurity region 105 will be described later.

The transfer switch M1 has an N-type source region 104, an N-type drain region 106a (an N-type active region, which is shown as FD (Floating Diffusion) since it may come in a floating state during operation), and a gate electrode layer 108a. The N-type source region 104 and the N-type drain region 106a are formed at a certain distance in the surface of the P-type semiconductor substrate 102. The gate electrode layer 108a is formed on the surface of the P-type semiconductor substrate 102 in the part interposed between the N-type source region 104 and the N-type drain region 106a, with a gate insulating layer 107 provided therebetween. The N-type impurity region 104 of the photodiode PD and the N-type source region 104 of the transfer switch M1 are the same region, though they were separately referred to as parts of different components.

The reset switch M2 has a pair of N-type source/drain regions 106a and a gate electrode layer 108b. The pair of N-type source/drain regions 106a are spaced at a certain distance in the surface of the semiconductor substrate 102. The gate electrode layer 108b is formed on the region between the pair of N-type source/drain regions 106a with a gate insulating layer (not shown) interposed therebetween. The N-type drain region 106a of the transfer switch M1 and one of the N-type source/drain regions 106a of the reset switch M2 are the same region, though they were separately referred to as parts of different components.

In the CMOS type image sensor shown in FIGS. 10 and 11, the charge generated in the photodiode PD is transferred to the N-type drain region 106a through a channel formed in the surface of the P-type semiconductor substrate 102 right under the gate insulating layer 107 of the transfer switch M1.

In the surface of the P-type semiconductor substrate 102, the area near the edges of the element isolation insulating layer 103 is susceptible to defects caused by stresses produced by formation of the element isolation insulating layer 103. Also, when the gate electrode layer 108a is formed by etching, the etching may damage the surface of the P-type semiconductor substrate 102 and cause defects. Furthermore, impurity implantation for forming the active regions, e.g. the N-type drain region 106a, is also likely to damage the surface of the P-type semiconductor substrate 102 and cause defects.

Thus part of the signal charge generated in the photodiode PD flows through the defects to cause a leakage current. The leakage current reduces the amount of charge transferred to the N-type drain region 106a, which reduces the sensitivity of the solid-state image sensor and deteriorates the characteristics of the pixels.

The P-type impurity region 105 is formed for the purpose of suppressing such leakage current. That is to say, even when defects are present in the vicinity of the surface of the P-type semiconductor substrate 102, the presence of the P-type impurity region 105 causes a PN-junction depletion layer to form between the P-type impurity region 105 and the N-type impurity region 104, which isolates the charge storage region in the N-type impurity region 104 from the defects, thereby preventing the charge generated in the photodiode PD from being taken into the defects. The leakage current caused by defects can thus be suppressed.

However, the formation of the P-type impurity region 105 alone cannot sufficiently suppress the leakage current. As stated above, in the surface of the P-type semiconductor substrate 102, defects are likely to be caused not only in the photodiode PD, but also in the vicinities of the edges of the element isolation insulating layer 103 and in the vicinity of the channel layer. Therefore leakage current may occur through defects formed in these portions.

SUMMARY OF THE INVENTION

An object of the present invention is to provide a semiconductor device having a solid-state image sensor with reduced leakage current.

According to the present invention, a semiconductor device includes: a semiconductor substrate of a first conductivity type; a first active region; a second active region; a control electrode; and a buried channel layer. The first active region is provided in a surface of the semiconductor substrate and has a second conductivity type which is different from the first conductivity type. The second active region is provided in the surface of the semiconductor substrate at a distance from the first active region and has the second conductivity type. The control electrode is provided on the surface of the semiconductor substrate in a part interposed between the first and second active regions. The buried channel layer is provided in the semiconductor substrate under the control electrode and has the second conductivity type. Further, the buried channel layer is in contact with both of the first and second active regions. The semiconductor substrate and the first active region constitute a photodiode which is part of a solid-state image sensor. The control electrode and the first and second active regions constitute a transistor which is part of the solid-state image sensor. Further, the buried channel layer has a lower impurity concentration than the first and second active regions.

According to the present invention, the semiconductor device has a buried channel layer which is in contact with both the first and second active regions. Accordingly the channel for transferring a charge generated in the photodiode can be formed in the vicinity of the interface between the buried channel layer and the semiconductor substrate. That is to say, it is possible to avoid channel formation in the defect-prone semiconductor substrate surface, thereby realizing a semiconductor device having a solid-state image sensor with reduced leakage current.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

This preferred embodiment realizes a semiconductor device having a solid-state image sensor which is less prone to leakage current through formation of a buried channel layer; the buried channel layer causes a channel to form away from the defect-prone semiconductor substrate surface.

Figure 1:
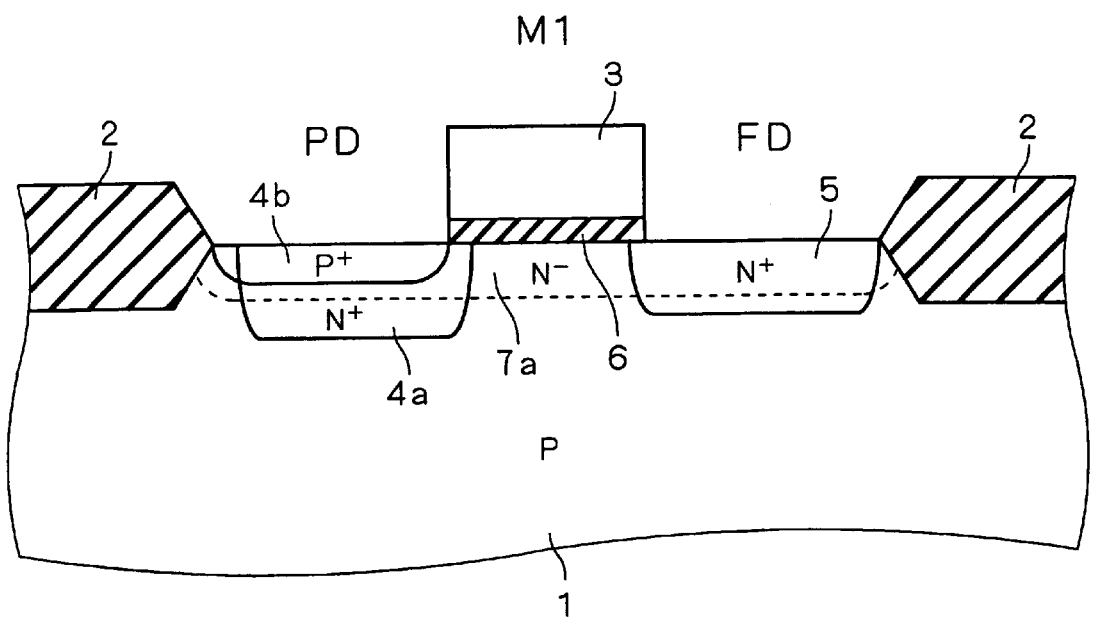
FIG. 1 is a cross-sectional view showing a semiconductor device according to a first preferred embodiment.
Figure 10:
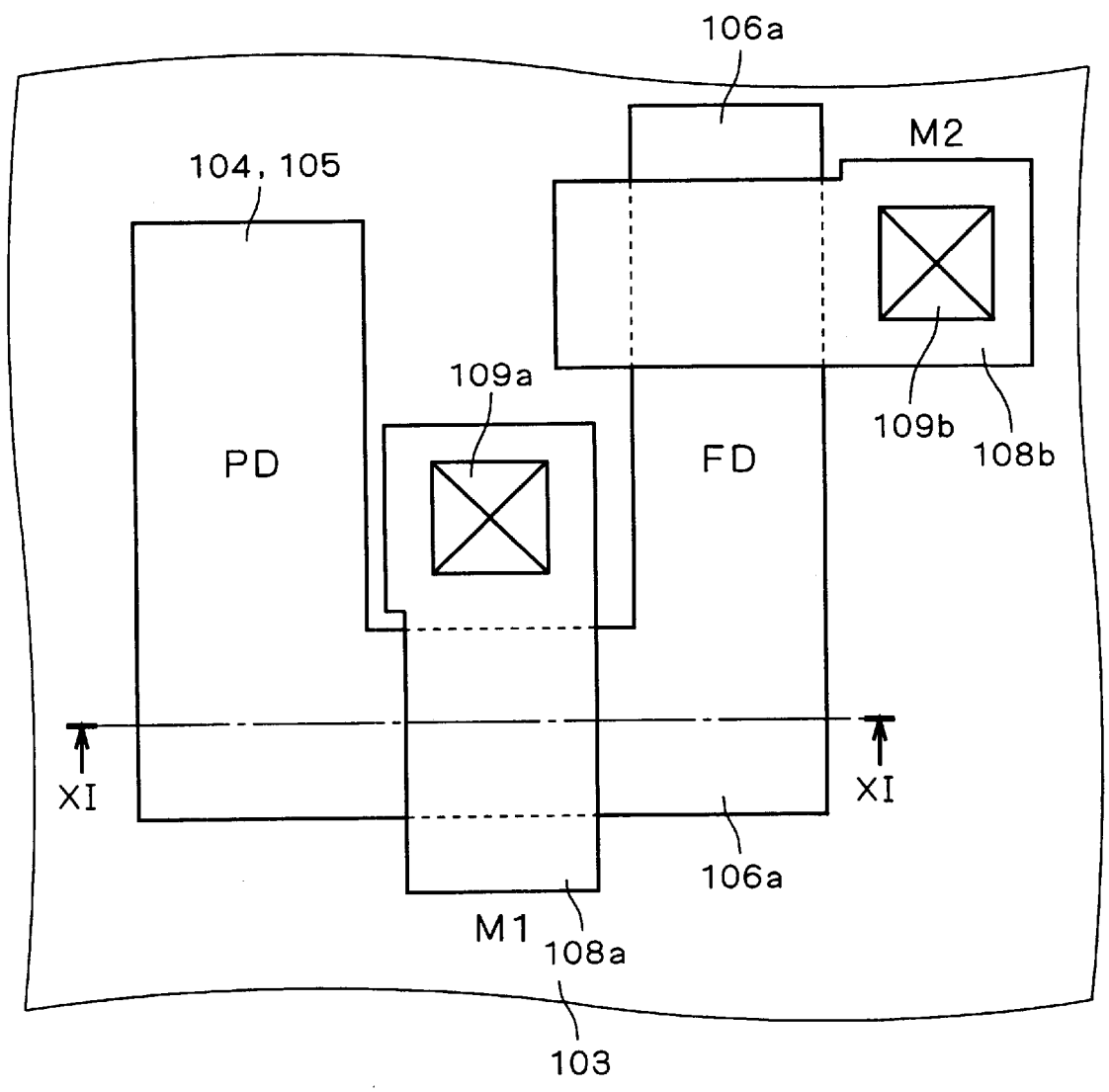
FIG. 10 is a top view showing the conventional semiconductor device.

FIG. 1 is a cross-sectional view showing a semiconductor device according to this preferred embodiment. As shown in FIG. 1, the semiconductor device of this preferred embodiment has a buried channel layer 7a; in other respects the structure is the same as that of the semiconductor device shown in FIGS. 10 and 11. That is to say, the semiconductor device of this preferred embodiment has a P-type semiconductor substrate 1, with an element isolation insulating layer 2 formed by LOCOS in the surface of the P-type semiconductor substrate 1. A photodiode PD, a transfer switch M1, and a reset switch M2 (not shown in FIG. 1) are closely arranged in the surface of the P-type semiconductor substrate 1.

The photodiode PD is formed of a PN junction between the P-type semiconductor substrate 1 and an N-type impurity region (an N-type active region) 4a. A P-type impurity region (a P-type active region) 4b is formed over the N-type impurity region 4a (or in the vicinity of the surface of the P-type semiconductor substrate 1). This P-type impurity region 4b is formed to such a depth that the depletion layer at the PN junction between the P-type semiconductor substrate 1 and the N-type impurity region 4a will not reach it.

The transfer switch M1 has an N-type source region 4a, an N-type drain region (an N-type active region, or a FD region) 5, and a gate electrode layer 3. The N-type source region 4a and the N-type drain region 5 are spaced at a certain distance in the surface of the P-type semiconductor substrate 1. The gate electrode layer 3 is formed on the surface of the P-type semiconductor substrate 1 in the part interposed between the N-type source region 4a and the N-type drain region 5, with a gate insulating layer 6 interposed therebetween. The N-type impurity region 4a of the photodiode PD and the N-type source region 4a of the transfer switch M1 are the same region, though they were separately referred to as parts of different components.

In the semiconductor device of this preferred embodiment, the N-type buried channel layer 7a, which has a lower impurity concentration than the N-type source region 4a and the N-type drain region 5, is formed in the channel region in the P-type semiconductor substrate 1 under the gate electrode layer 3, the N-type source region 4a, and the N-type drain region 5.

The N-type buried channel layer 7a is added to the structure of the semiconductor device shown in FIG. 11 for the reason shown below.

Figure 11:
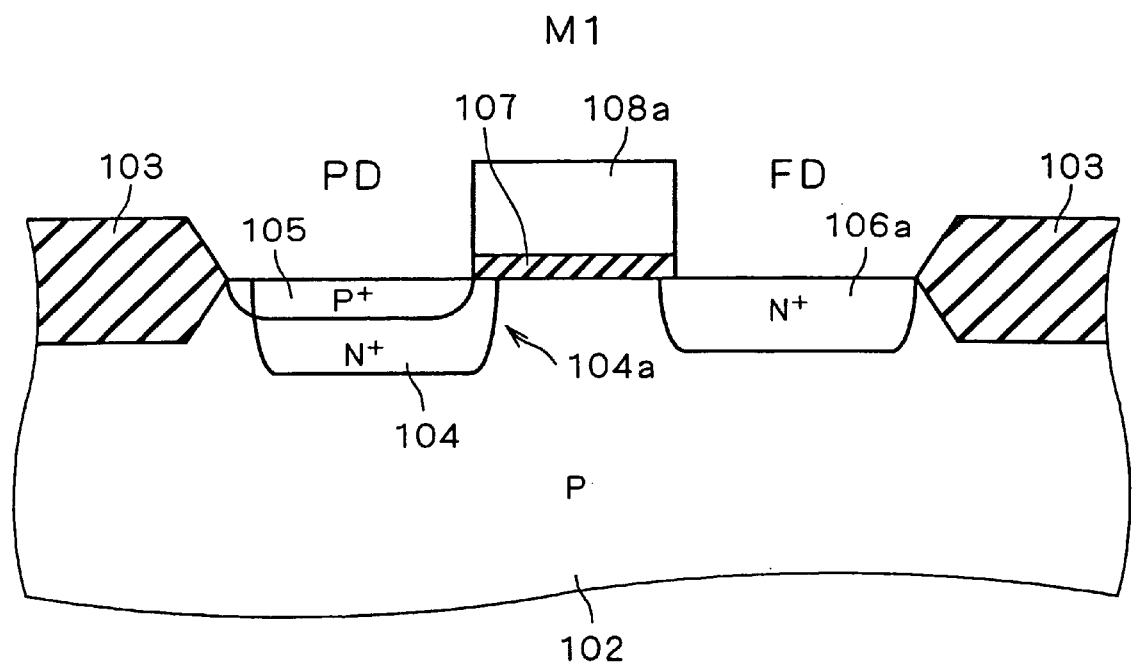
FIG. 11 is a cross-sectional view showing the conventional semiconductor device.

In the semiconductor device shown in FIG. 11, the channel of the MOS transistor serving as the transfer switch M1 is formed in the surface portion of the P-type semiconductor substrate 102. However, as mentioned earlier, the surface portion of the P-type semiconductor substrate 102 is subject to various types of defects, which are likely to cause leakage current. Accordingly, the influence of such defects will be removed when the channel is formed in a deeper part under the surface of the P-type semiconductor substrate 102.

When the N-type buried channel layer 7a is formed in the P-type semiconductor substrate 1, the potential is high near the surface of the P-type semiconductor substrate 1 where defects are present, but the potential is minimized in the vicinity of the PN junction plane formed by the N-type buried channel layer 7a and the P-type semiconductor substrate 1. Accordingly, when the transfer switch M1 operates, the channel for causing the N-type source region 4a and the N-type drain region 5 to conduct to each other is formed in the vicinity of the PN junction plane. Then the charge stored in the N-type source region 4a can be propagated to the N-type drain region 5 without suffering leakage current.

The following shows examples of species and concentrations of impurities implanted into the individual regions: about $1\times10^{15}$ to $1\times10^{16}$ atoms/cm$^3$ of boron into the P-type semiconductor substrate 1; about $1\times10^{20}$ to $1\times10^{21}$ atoms/cm$^3$ of phosphorus or arsenic into the N-type source region 4a and the N-type drain region 5; about $1\times10^{17}$ to $1\times10^{18}$ atoms/cm$^3$ of boron into the P-type impurity region 4b; and about $1\times10^{16}$ to $1\times10^{17}$ atoms/cm$^3$ of phosphorus or arsenic into the N-type buried channel layer 7a.

With the impurity concentrations shown above, the transfer switch M1 can be kept enhancement type (normally-off type) even in the presence of the N-type buried channel layer 7a.

FIG. 1 shows the N-type buried channel layer 7a extending into the N-type source region 4a and the N-type drain region 5. For example, this structure can be obtained by, prior to the formation of the gate insulating layer 6, ion-implanting an N-type impurity, such as phosphorus or arsenic, into the surface of the P-type semiconductor substrate 1 where the element isolation insulating layer 2 has already been formed.

However, the N-type buried channel layer 7a can work as long as it has a function as a channel for transferring the charge stored in the N-type source region 4a to the N-type drain region 5. Therefore it is not essential that the N-type buried channel layer 7a extends also in the N-type source region 4a and the N-type drain region 5. That is to say, the N-type buried channel layer 7a can work satisfactorily as long as it is formed to come in contact with the N-type source region 4a and the N-type drain region 5.

According to this preferred embodiment, the semiconductor device has the N-type buried channel layer 7a which is in contact with both the N-type source region 4a and the N-type drain region 5. Accordingly the channel for transferring the charge generated in the photodiode PD is formed in the vicinity of the interface between the N-type buried channel layer 7a and the P-type semiconductor substrate 1. That is to say, it is possible to avoid channel formation in the defect-prone surface of the P-type semiconductor substrate 1, thereby providing a semiconductor device having a solid-state image sensor which is less susceptible.to leakage current.

Second Preferred Embodiment

This preferred embodiment is a variation of the semiconductor device of the first preferred embodiment, where the N-type buried channel layer 7a is replaced by an N-type buried channel layer which is shallower under the gate electrode layer 3.

Figure 2:
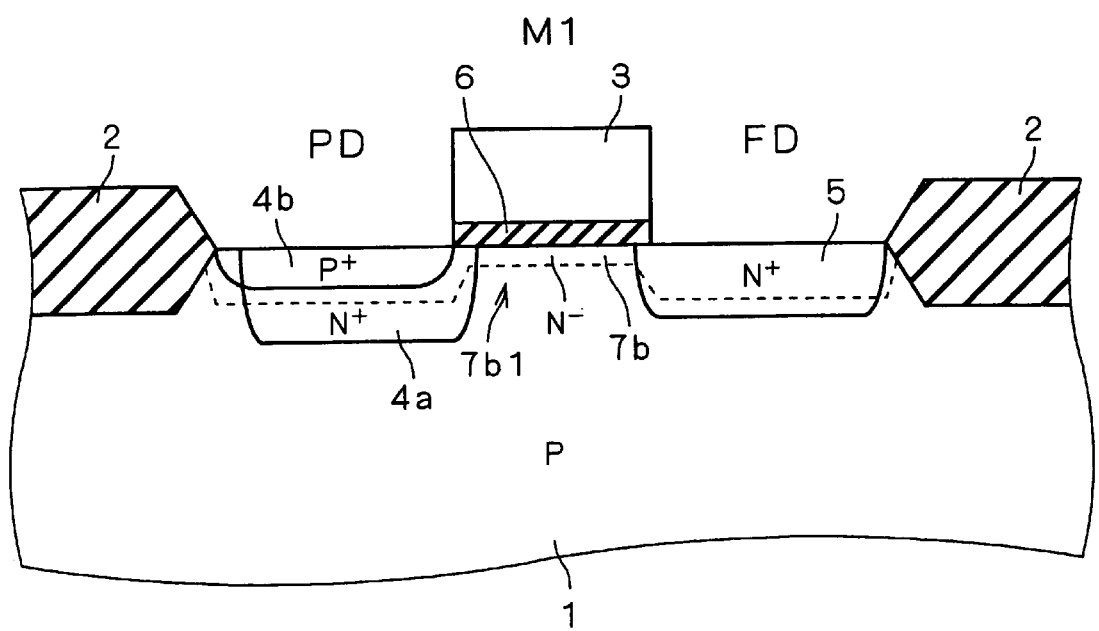
FIG. 2 is a cross-sectional view showing a semiconductor device according to a second preferred embodiment.

FIG. 2 is a cross-sectional view showing a semiconductor device according to this preferred embodiment. In FIG. 2, elements having the same functions as those in the semiconductor device of the first preferred embodiment are shown at the same reference characters. As shown in FIG. 2, the semiconductor device has an N-type buried channel layer 7b in place of the N-type buried channel layer 7a; the N-type buried channel layer 7b has a shallower buried layer portion 7b1 under the gate electrode layer 3. In other respects the structure is the same as that of the semiconductor device of the first preferred embodiment and therefore not described again here.

This structure is obtained by forming the buried channel layer not before the formation of the gate insulating layer 6 but after the formation of the gate insulating layer 6 and the gate electrode layer 3. That is to say, the N-type buried channel layer 7b can be formed by ion-implanting an N-type impurity, such as phosphorus or arsenic, into the surface of the P-type semiconductor substrate 1 where the element isolation insulating layer 2, the gate insulating layer 6 and the gate electrode layer 3 have already been formed.

In this way, whether the buried channel layer is formed in the process before or after the formation of the gate insulating layer 6 and the gate electrode layer 3, the resultant semiconductor device structures differ only in the depth of the buried layer under the gate electrode layer 3. Accordingly the semiconductor device of this preferred embodiment provides the same effect as that of the first preferred embodiment.

Third Preferred Embodiment

This preferred embodiment, too, is a variation of the semiconductor device of the first preferred embodiment, which realizes a semiconductor device in which the N-type buried channel layer 7a has a greater depth than the P-type impurity region 4b. This eliminates the necessity of intentionally locating the edge of the P-type impurity region 4b and the edge of the N-type impurity region 4a at shifted positions.

In the semiconductor device shown in FIG. 1, transferring the charge stored in the N-type impurity region 104 to the N-type drain region 106a through the channel requires that the N-type impurity region 104 have at its edge a gate overlap portion 104a which, near the edge of the gate electrode layer 108a, protrudes from the edge of the P-type impurity region 105 toward the channel.

Suppose that the N-type impurity region 104 does not have the gate overlap portion 104a but that, for example, the edge of the N-type impurity region 104 and the edge of the P-type impurity region 105 are located in the same position. Then the N-type impurity region 104 may not become conductive to the channel formed under the gate electrode layer 108a, because the P-type impurity region 105 intervenes between the channel and the N-type impurity region 104.

Since the function as the transfer switch M1 is hindered in this case, the N-type impurity region 104 has the gate overlap portion 104a to ensure a path between the channel and the N-type impurity region 104.

However, providing the gate overlap portion 104a requires precisely controlling the amounts of implanted impurities, the implant angles, etc. during formation of the N-type impurity region 104 and the P-type impurity region 105, which involves difficulties in production.

Furthermore, even in the presence of the gate overlap portion 104a, leakage current is likely to flow depending on the defect conditions of the surface of the P-type semiconductor substrate 1, causing variations in solid-state image sensor characteristics among products.

Accordingly, in this preferred embodiment, the N-type buried channel layer 7a is formed deeper than the P-type impurity region 4b, so as to ensure a stable path between the N-type source region 4a and the channel.

Figure 3:
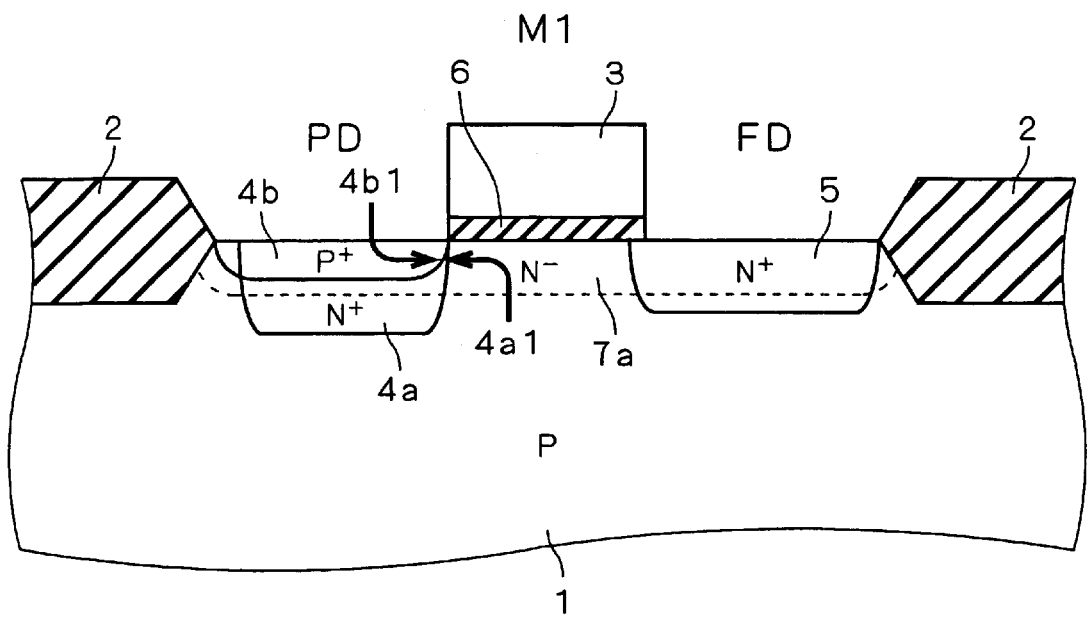
FIG. 3 is a cross-sectional view showing a semiconductor device according to a third preferred embodiment.

FIG. 3 is a cross-sectional view showing a semiconductor device according to this preferred embodiment. In FIG. 3, too, the elements having the same functions as those of the semiconductor device of the first preferred embodiment are shown by the same reference characters. In this semiconductor device, the N-type buried channel layer 7a is formed deeper than the P-type impurity region 4b. Also, the edge 4b1 of the P-type impurity region 4b and the edge 4a1 of the N-type impurity region 4a correspond to each other. In other respects the structure is the same as that of the semiconductor device of the first preferred embodiment and therefore not described here again.

The N-type buried channel layer 7a deeper than the P-type impurity region 4b allows the charge to be passed from the N-type impurity region 4a to the N-type buried channel layer 7a even if, on the side closer to the N-type drain region 5, the edge 4b1 of the P-type impurity region 4b overlaps the edge 4a1 of the N-type impurity region 4a. Accordingly it is not necessary to intentionally locate, on the side closer to the N-type drain region 5, the edge 4b1 of the P-type impurity region 4b and the edge 4a1 of the N-type impurity region 4a at shifted positions, which makes easier the manufacture of the semiconductor device.

Furthermore, the path from the N-type impurity region 4a to the channel is not formed in the surface of the P-type semiconductor substrate 1 where leakage current is likely to flow, so that the charge can be steadily supplied from the N-type impurity region 4a to the N-type buried channel layer 7a. This realizes a semiconductor device having a solid-state image sensor with reduced characteristic variations among products.

Since the semiconductor device of the first preferred embodiment shown in FIG. 1, too, has the N-type buried channel layer 7a which is formed deeper than the P-type impurity region 4b, it has the same effect as the semiconductor device of this preferred embodiment.

Fourth Preferred Embodiment

This preferred embodiment is also a variation of the semiconductor device of the first preferred embodiment, where the N-type drain region 5 is absent; instead, the semiconductor device utilizes as the drain region the N-type buried channel layer 7a which extends in the region for the N-type drain region 5.

Figure 4:
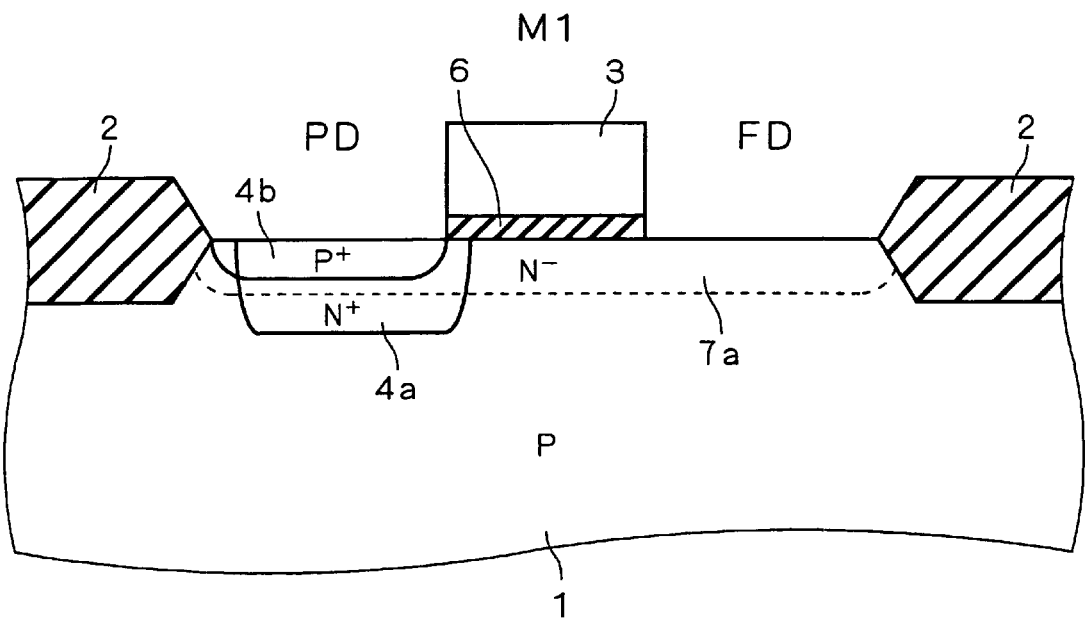
FIG. 4 is a cross-sectional view showing a semiconductor device according to a fourth preferred embodiment.

FIG. 4 is a cross-sectional view showing a semiconductor device of this preferred embodiment. In FIG. 4, too, the elements having the same functions as those in the semiconductor device of the first preferred embodiment are shown by the same reference characters. In this semiconductor device, the N-type drain region 5 is removed. In other respects the structure is the same as that of the semiconductor device of the first preferred embodiment and therefore not described again here.

The N-type drain region 5, which has high impurity concentration, is thus absent, and therefore the impurity implantation for formation of the N-type drain region 5 is not needed. The surface of the P-type semiconductor substrate 1 is then less likely to suffer defects, and so the leakage current is less likely to occur.

Fifth Preferred Embodiment

This preferred embodiment is also a variation of the semiconductor device of the first preferred embodiment, where the N-type drain region 5 has its periphery spaced at a certain distance from the edge of the element isolation insulating layer 2.

Figure 5:
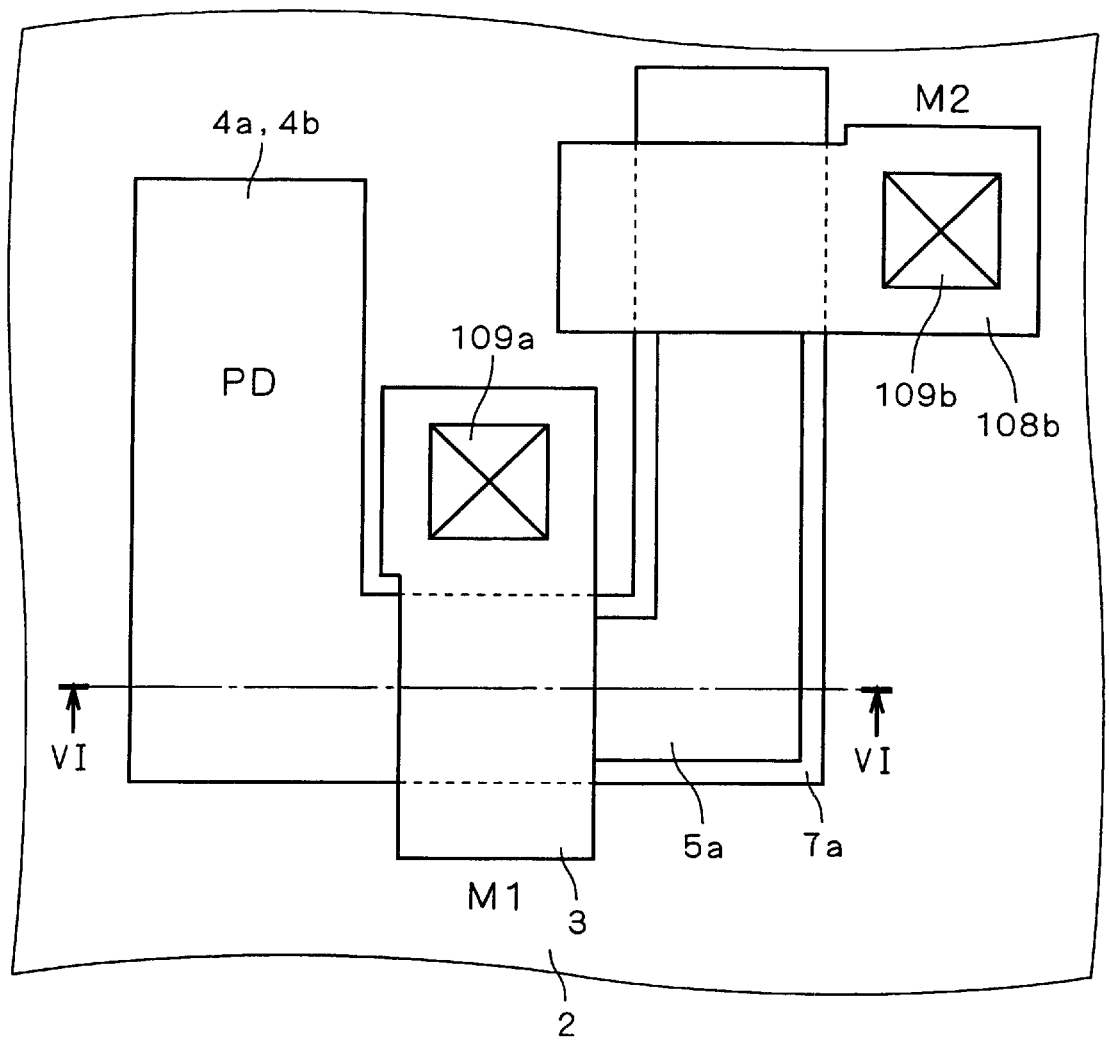
FIG. 5 is a top view showing a semiconductor device according to a fifth preferred embodiment.
Figure 6:
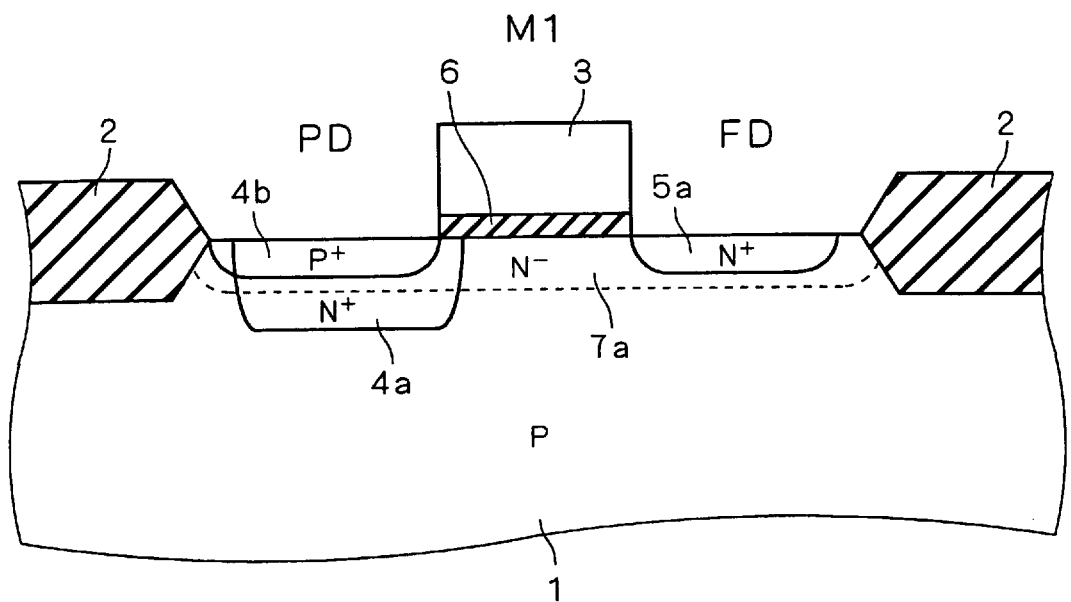
FIG. 6 is a cross-sectional view showing the semiconductor device of the fifth preferred embodiment.

FIG. 5 is a top view showing a semiconductor device of this preferred embodiment and FIG. 6 is the cross-sectional view taken along the line VI—VI in FIG. 5. In FIGS. 5 and 6, too, the elements having the same functions as those in the semiconductor device of the first preferred embodiment are shown by the same reference characters.

In this preferred embodiment, as shown in FIGS. 5 and 6, the N-type drain region 5a has its periphery spaced at a certain distance from the edges of the element isolation insulating layer 2. In other respects the structure is the same as that of the semiconductor device of the first preferred embodiment and therefore not described again here.

As shown above, in a structure in which the element isolation insulating layer 2 has an edge extending along the periphery of the N-type drain region 5a, the periphery of the N-type drain region 5a is separated at a certain distance from the surrounding edge of the element isolation insulating layer 2. Thus the N-type drain region 5a does not reside close to the edge of the element isolation insulating layer 2 where defects are likely to be present, which further prevents the leakage current.

This structure can be easily obtained by, while forming the N-type drain region 5a by ion implantation, forming the opening of the photoresist inside the edges of the element isolation insulating layer 2, for example.

Sixth Preferred Embodiment

This preferred embodiment, too, is a variation of the semiconductor device of the first preferred embodiment, where the depth of the N-type buried channel layer from the surface of the P-type semiconductor substrate 1 at least reaches the depth of the N-type impurity region 4a.

Figure 7:
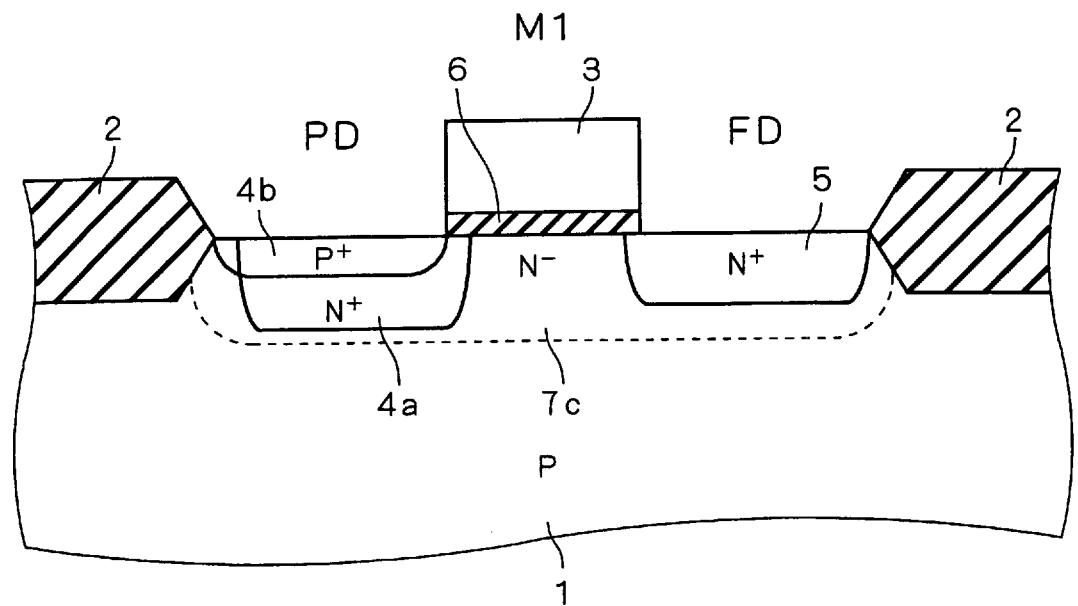
FIG. 7 is a cross-sectional view showing a semiconductor device according to a sixth preferred embodiment.

FIG. 7 is a cross-sectional view showing a semiconductor device of this preferred embodiment. In FIG. 7, too, the elements having the same functions as those in the semiconductor device of the first preferred embodiment are shown by the same reference characters.

In this preferred embodiment, as shown in FIG. 7, the N-type buried channel layer 7a is formed as an N-type buried channel layer 7c which is deeper from the surface of the P-type semiconductor substrate 1. The depth of this N-type buried channel layer 7c is such that it reaches the depth of the N-type impurity region 4a at least. In other respects the structure is the same as that of the first preferred embodiment and therefore not described again here.

As shown above, when the N-type buried channel layer 7c at least reaches the depth of the N-type impurity region 4a, the N-type buried channel layer 7c is combined with the N-type impurity region 4a, so that the impurity concentration of the N-type impurity region 4a is increased and the surface area of the interface between the N-type impurity region 4a and the P-type semiconductor substrate 1 is enlarged, which increases the junction capacitance between the P-type semiconductor substrate 1 and the N-type impurity region 4a. This in turn increases the amount of storage of the charge generated in the photodiode PD, thereby increasing the signal intensity and improving the characteristics of the pixels.

The N-type buried channel layer 7c is formed deeper for the purpose of increasing the junction capacitance between the P-type semiconductor substrate 1 and the N-type impurity region 4a. Accordingly it is necessary that the N-type buried channel layer 7c at least extend into the N-type impurity region 4a and that the N-type buried channel layer 7c be deeper in the N-type impurity region 4a and its vicinity.

In other words, it is not necessary to form the N-type buried channel layer 7c deeper on the side of the N-type drain region 5. This will be explained in the next preferred embodiment.

Seventh Preferred Embodiment

This preferred embodiment is a variation of the semiconductor device of the sixth preferred embodiment; in the semiconductor device, the depth of the N-type buried channel layer from the surface of the P-type semiconductor substrate 1 is smaller in the N-type drain region 5 and its vicinity than on the side of the N-type impurity region 4a.

Figure 8:
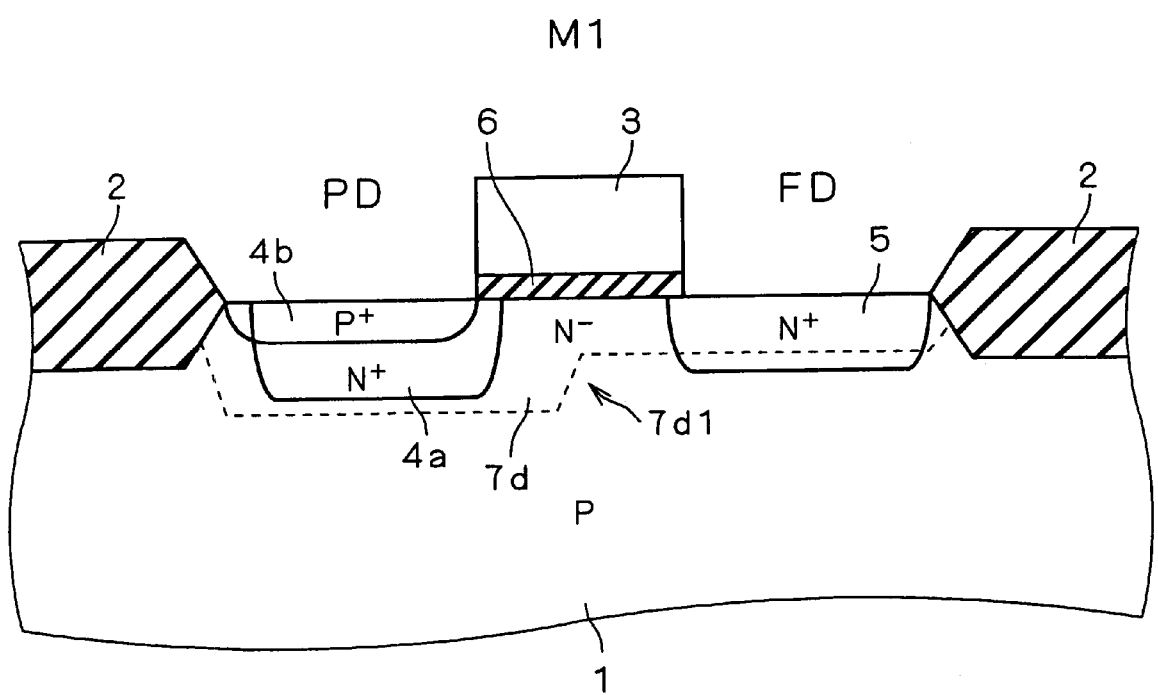
FIG. 8 is a cross-sectional view showing a semiconductor device according to a seventh preferred embodiment.
Figure 9:
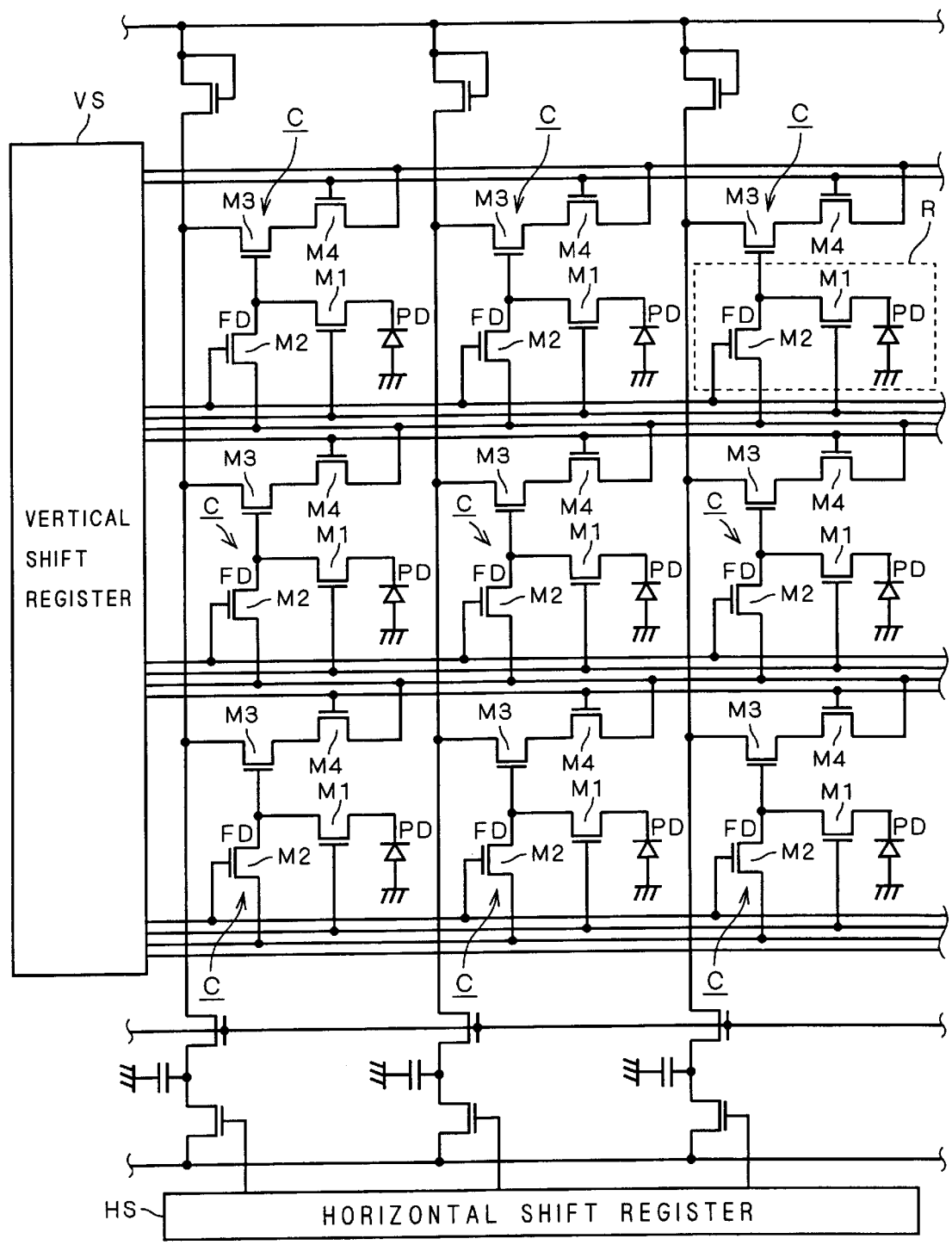
FIG. 9 is a diagram showing the circuit configuration of a semiconductor device having a CMOS-type image sensor.

FIG. 8 is a cross-sectional view showing a semiconductor device of this preferred embodiment. In FIG. 8, too, the elements having the same functions as those in the semiconductor device of the sixth preferred embodiment are shown by the same reference characters.

In this preferred embodiment, as shown in FIG. 8, the N-type buried channel layer 7c is replaced by an N-type buried channel layer 7d which has a step 7d1 in the channel portion. The depth of the N-type buried channel layer 7d in the N-type impurity region 5 and its vicinity is smaller than the depth of the N-type buried channel layer 7d in the N-type impurity region 4a and its vicinity. In other respects the structure is the same as that of the semiconductor device of the sixth preferred embodiment and therefore not described here again.

As shown above, the N-type buried channel layer 7d is shallower in the N-type drain region 5 and its vicinity than on the N-type impurity region 4a side, so that the surface area of the interface between the P-type semiconductor substrate 1 and the N-type drain region 5 combined with the N-type buried channel layer 7d is never larger than the surface area of the interface between the P-type semiconductor substrate 1 and the N-type impurity region 4a combined with the N-type buried channel layer 7d. Therefore the junction capacitance between the N-type drain region 5 and the P-type semiconductor substrate 1 is smaller than the junction capacitance between the N-type impurity region 4a and the P-type semiconductor substrate 1.

When the junction capacitance between the N-type drain region 5 and the P-type semiconductor substrate 1 is small, then a larger voltage signal can be outputted with the same amount of charge, from the relation Q=CV (where Q: the amount of charge generated in the photodiode PD, C: the junction capacitance of the N-type drain region 5 and the P-type semiconductor substrate 1, and V: the voltage signal outputted in the N-type drain region 5). The voltage signal outputted from the N-type drain region 5 can thus be strengthened.

The N-type buried channel layer 7d having the step 7d1 in the channel portion can be formed by, for example, preparing a photomask for forming the region on the N-type drain region 5 side of the step 7d1 and a photomask for forming the region on the N-type impurity region 4a side of the step 7d1 and varying the depth of ion implantation.

While the invention has been described in detail, the foregoing description is in all aspects illustrative and not restrictive. It is understood that numerous other modifications and variations can be devised without departing from the scope of the invention.

What is claimed is:

1. A semiconductor device, comprising:

a semiconductor substrate of a first conductivity type;

a first active region provided in a surface of said semiconductor substrate and having a second conductivity type which is different from said first conductivity type;

a second active region provided in the surface of said semiconductor substrate at a distance from said first active region and having said second conductivity type;

a control electrode provided on the surface of said semiconductor substrate in a part interposed between said first and second active regions; and a buried channel layer provided in said semiconductor substrate under said control electrode and having said second conductivity type, said buried channel layer being in contact with both of said first and second active regions;

said semiconductor substrate and said first active region constituting a photodiode which is part of a solid-state image sensor;

said control electrode and said first and second active regions constituting a transistor which is part of said solid-state image sensor; and said buried channel layer having a lower impurity concentration than said first and second active regions.

2. The semiconductor device according to claim 1, further comprising a third active region having said first conductivity type and provided in the surface of said first active region, wherein said buried channel layer has a larger depth than said third active region from the surface of said semiconductor substrate.

3. The semiconductor device according to claim 1, wherein said second active region is absent, and instead, said buried channel layer is extended also in the region where said second active region would reside if present.

4. The semiconductor device according to claim 1, further comprising an element isolation insulating layer provided in the surface of said semiconductor substrate and having an edge extending along a periphery of said second active region, wherein said second active region is provided in said semiconductor substrate with its said periphery spaced at a certain distance from said edge of said element isolation insulating layer.

5. The semiconductor device according to claim 1, wherein said buried channel layer extends also in the part where said first active region is provided and overlaps said first active region, and in said first active region and its vicinity, the depth of said buried channel layer from the surface of said semiconductor substrate at least reaches the depth of said first active region from the surface of said semiconductor substrate.

6. The semiconductor device according to claim 5, wherein said buried channel layer extends also in the part where said second active region is provided and overlaps said second active region, and in said second active region and its vicinity, said buried channel layer has a smaller depth from the surface of said semiconductor substrate than in said first active region and its vicinity.

* * * * *